(12) United States Patent
Cho

(10) Patent No.: US 7,776,496 B2
(45) Date of Patent: Aug. 17, 2010

(54) PHOTOMASK LAYOUT PATTERN

(75) Inventor: Kuo-Yao Cho, Taichung County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 365 days.

(21) Appl. No.: 11/847,345

(22) Filed: Aug. 30, 2007

(65) Prior Publication Data

US 2009/0029267 A1    Jan. 29, 2009

(30) Foreign Application Priority Data

Jul. 24, 2007    (TW) ............................... 96126908 A

(51) Int. Cl.
G03F 1/00    (2006.01)
(52) U.S. Cl. ........................ 430/5; 430/311; 430/394
(58) Field of Classification Search ................ 430/5, 430/311; 438/669
See application file for complete search history.

(56) References Cited

U.S. PATENT DOCUMENTS

| 5,821,014 A | 10/1998 | Chen |
| 2006/0070018 A1 | 3/2006 | Semmler |
| 2006/0083996 A1 | 4/2006 | Kim |
| 2007/0243707 A1* | 10/2007 | Manger et al. ............... 438/669 |
| 2007/0292777 A1* | 12/2007 | Melvin et al. .................. 430/30 |
| 2008/0138588 A1* | 6/2008 | Schroeder et al. ........ 428/195.1 |

FOREIGN PATENT DOCUMENTS

EP    1 241 525 A2    9/2002

\* cited by examiner

Primary Examiner—Mark F Huff
Assistant Examiner—Rashid Alam
(74) Attorney, Agent, or Firm—Winston Hsu

(57) ABSTRACT

A photomask layout pattern including an H-shaped pattern having a first opaque line pattern in parallel with a second opaque line pattern and a central zone connecting the first and second line patterns. A zebra-crossing-like dense line and space pattern is disposed in the central zone. The pitch of the zebra-crossing-like dense line and space pattern is beyond the resolution limit of an exposure tool such that light passing the central zone has an exposure energy that is not adequate to form corresponding line/space image on a photoresist.

17 Claims, 5 Drawing Sheets

PHOTOMASK LAYOUT PATTERN

BACKGROUND OF THE INVENTION

1. Field of the Invention

The present invention relates generally to the field of semiconductor technology and, more particularly, to an improved photomask layout pattern that is suited for the transfer of H-shaped micro patterns without the need of employing optical proximity correction (OPC).

2. Description of the Prior Art

In semiconductor manufacturing processes, in order to transfer an integrated circuit layout onto a semiconductor wafer, the integrated circuit layout is first designed and formed as a lithography pattern. Then, the lithography pattern is transferred to form a photo mask pattern. The photo mask pattern is then proportionally transferred to a photoresist layer positioned on the semiconductor wafer.

As a design pattern of an integrated circuit becomes smaller and due to a resolution limit of an optical exposure tool, an optical proximity effect occurs during the photolithographic process performed for transferring the photo mask pattern with higher density. The optical proximity effect causes defects when transferring the photo mask pattern, such as residue of an assistant feature next to a right-angle main feature, right-angle corner rounding, line end shortening, and line width increasing/decreasing.

To avoid the above-mentioned problems of the optical proximity effect, resolution enhancement technology (RET) and optical proximity effect correction (OPC) are applied. The OPC process uses a computer aided design (CAD) with exposing parameters and a calculation software to correct the original photomask pattern of the original photomask layout and create a corrected photomask layout. The corrected photomask layout is then input into a computer to produce a photomask.

Please refer to FIG. 1 and FIG. 2. FIG. 1 is an enlarged top view of an exemplary H-shaped layout pattern on a mask, and FIG. 2 illustrates an after-develop-inspect (ADI) pattern that is transferred from the mask of FIG. 1 to a photoresist layer through conventional lithographic processes. As shown in FIG. 1, the shaded region is opaque chrome area, while the blank region is transparent area. In the original designed H-shaped layout pattern 1, no OPC auxiliary patterns are added. However, after lithography, the ADI pattern transferred to the photoresist layer has some defects including pull back of the end of the line-shaped pattern 2 and tapered bottleneck on the line shaped space pattern 3 adjacent to the H-shaped layout pattern 1. The dashed line indicated in FIG. 2 denotes the ideal position of the distal end of the line-shaped pattern 2. Compared to the ideal position, the deviation may be about 50 nm at each side.

Conventionally, OPC methods are employed to solve the above-mentioned problems. As shown in FIG. 3, for example, hammerhead patterns 4 are added into the H-shaped layout pattern 1 to alleviate the pull back of the end of the line-shaped pattern 2. However, the hammerhead patterns 4 cannot solve the tapered bottleneck on the line shaped space pattern 3. Further, the conventional OPC methods are time-consuming and expensive.

SUMMARY OF THE INVENTION

It is therefore a primary object of the present invention to provide an improved photomask layout pattern in order to solve the above-mentioned problems.

According to the claimed invention, a photomask layout pattern comprises an H-shaped pattern having a first opaque line pattern in parallel with a second opaque line pattern and a zebra-crossing central zone connecting the first and second line patterns, wherein a dense line-space pattern is disposed in the central zone. The pitch of the dense line-space pattern is beyond resolution limit of an exposure tool such that light passing the central zone has an exposure energy that is not adequate to form corresponding line-space image on a photoresist layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
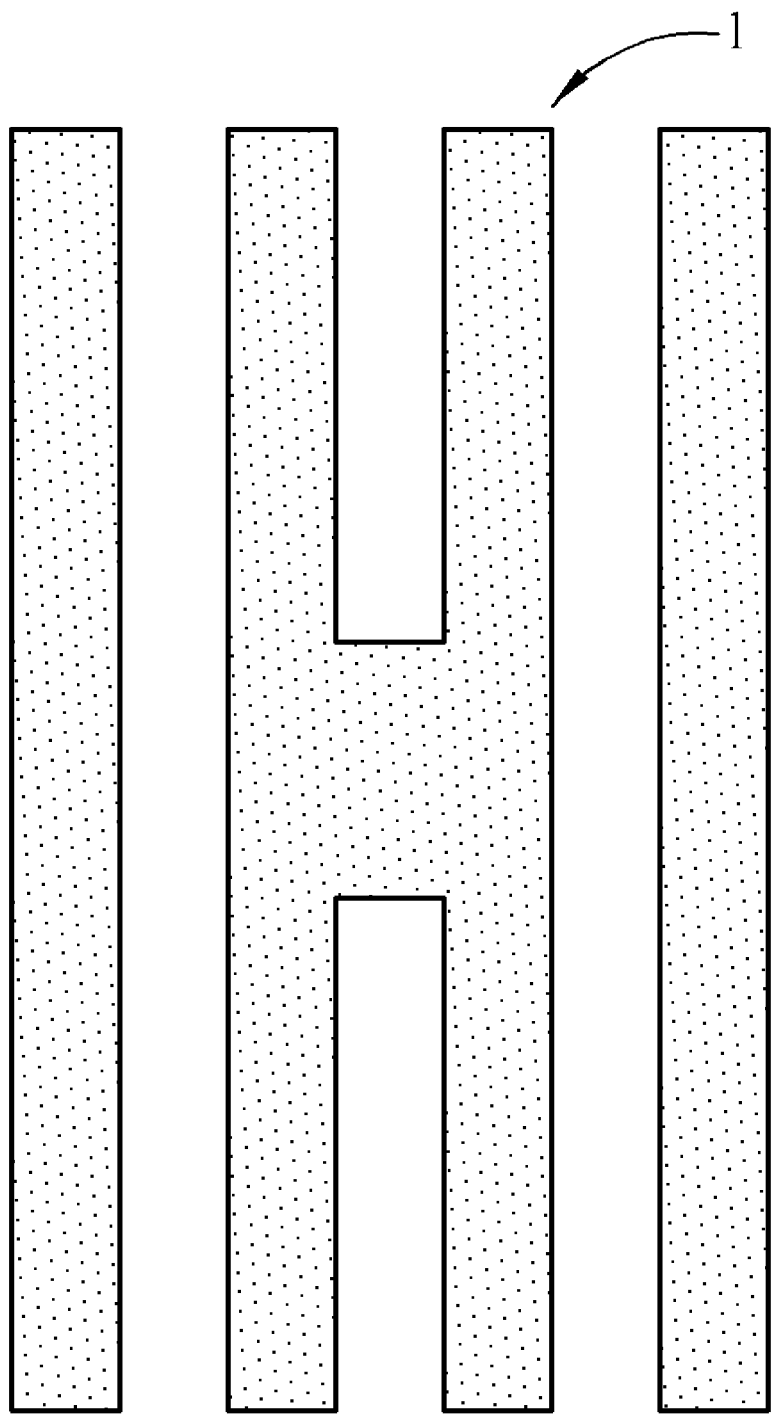
FIG. 1 is an enlarged top view of an exemplary H-shaped layout pattern on a photomask.
Figure 2:
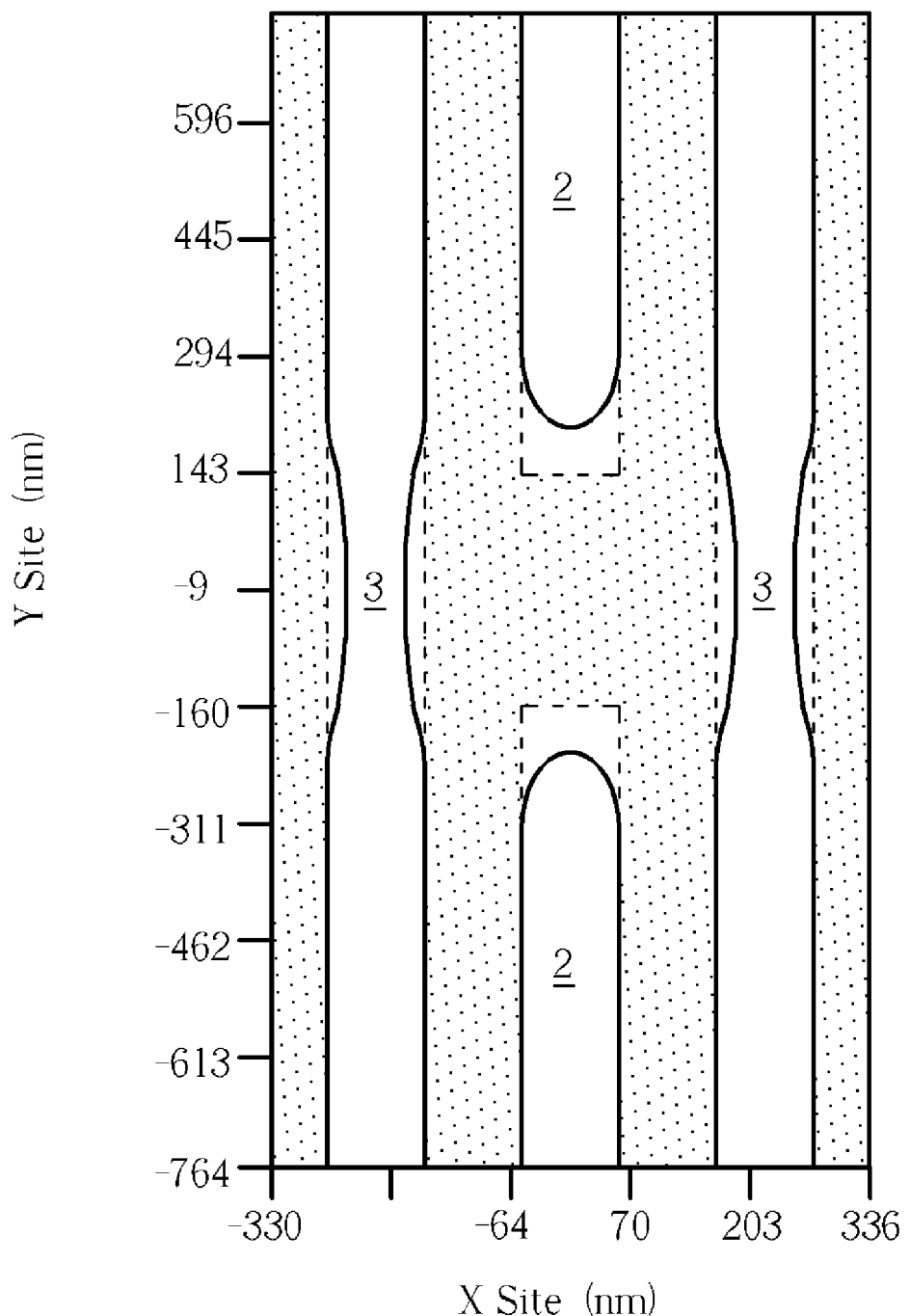
FIG. 2 illustrates an after-develop-inspect (ADI) pattern that is transferred from the photomask of FIG. 1 to a photoresist layer on a wafer through conventional lithographic processes.
Figure 3:
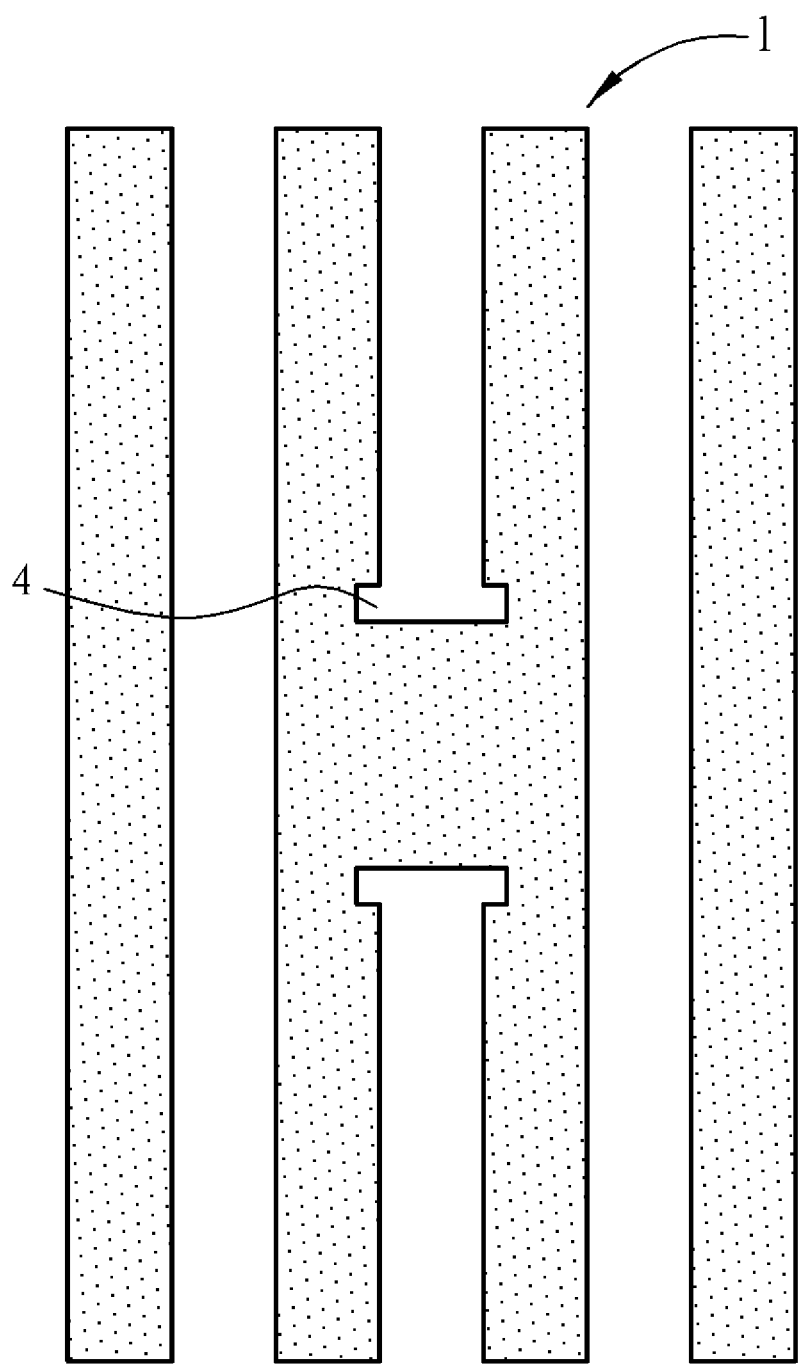
FIG. 3 illustrates the modified layout pattern after incorporating the hammerhead patterns into the H-shaped layout pattern.
Figure 4:
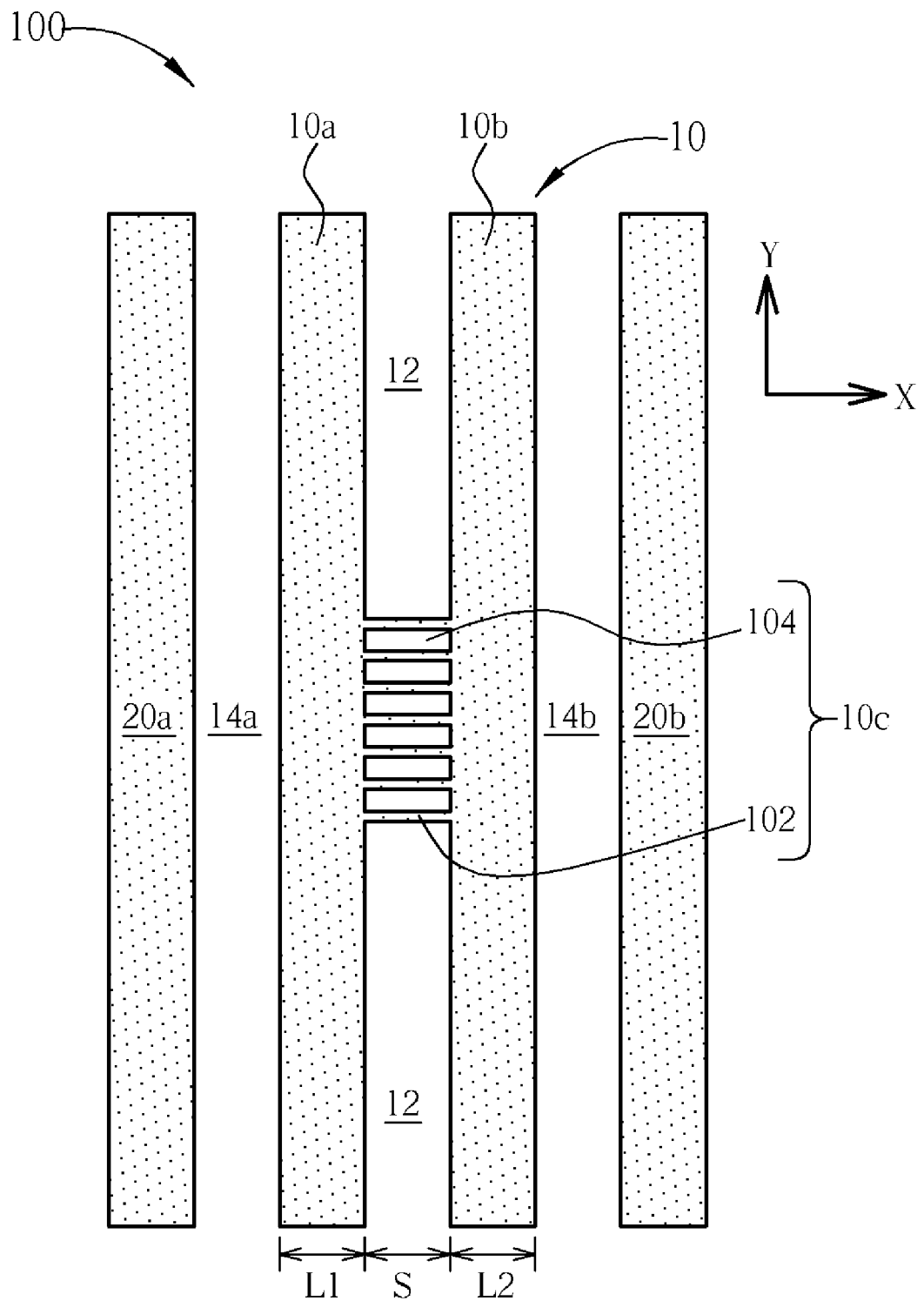
FIG. 4 is an enlarged top view of an improved photomask layout pattern in accordance with one preferred embodiment of this invention.

Please refer to FIG. 4. FIG. 4 is an enlarged top view of an improved photomask layout pattern in accordance with one preferred embodiment of this invention, wherein likewise the shaded region represents opaque area such as chrome pattern, and the blank region represents transparent area or pattern.

It is the primary object of the present invention to precisely transfer the photomask layout pattern 100 as set forth in FIG. 4 to a photoresist layer, wherein the pull back of each side of the line-shaped pattern 12 can be controlled to a value that is less than 10 nm. In addition, the tapered bottleneck problem occurs on the line shaped space patterns 14a and 14b next to the H-shaped layout pattern can be effectively resolved.

As shown in FIG. 4, the photomask layout pattern 100 comprises an H-shaped pattern 10 comprising a first opaque line pattern 10a in parallel with a second opaque line pattern 10b and a central zone 10c connecting the first and second line patterns 10a and 10b. The parallel first and second line patterns 10a and 10b are arranged along the reference y-axis.

According to the preferred embodiment of this invention, the first opaque line pattern 10a has a line width $L_1$ that is substantially equal to the line width $L_2$ of the second opaque line pattern 10b. For example, $L_1=L_2=0.11$ μm.

According to the preferred embodiment of this invention, the line width $L_1$ of the first opaque line pattern 10a, the line width $L_2$ of the second opaque line pattern 10b and the space S between the first opaque line pattern 10a and the second opaque line pattern 10b are the same. For example, $L_1=L_2=S=0.11$ μm.

According to the preferred embodiment of this invention, the span of the central zone 10c along the reference y-axis is about 0.37 micrometers. The present invention is characterized in that a dense line-space pattern is disposed in the central zone 10c containing a plurality of opaque lines (arranged along the reference x-axis) and space patterns 104 between lines 102. The dense line-space pattern is similar to a zebra-crossing pattern.

The pitch of the dense line-space pattern is beyond resolution limit of an exposure tool such that light passing the central zone 10c has an exposure energy that is not adequate to form corresponding line-space image on or in a photoresist layer.

By way of example, such pitch may be less than 130 nm when a 193 nm exposure tool is employed and no off-axis illumination is used. In such case, the ratio of the line width of the line 102 and the width of the space pattern 104 may be 65/65 or 90/40, but not limited thereto.

Further, according to the preferred embodiment of this invention, the photomask layout pattern 100 comprises a third opaque line pattern 20a that is situated next to the first opaque line pattern 10a and is opposite to the central zone 10c, a space pattern 14a between the first opaque line pattern 10a and the third opaque line pattern 20a, a fourth opaque line pattern 20b that is situated next to the second opaque line pattern 10b and is opposite to the central zone 10c, a space pattern 14b between the second opaque line pattern 10b and the fourth opaque line pattern 20b.

According to the preferred embodiment of this invention, the line widths of the parallel first opaque line pattern 10a, the second opaque line pattern 10b, the third opaque line pattern 20a and the fourth opaque line pattern 20b are substantially the same. For example, the line widths of the parallel first opaque line pattern 10a, the second opaque line pattern 10b, the third opaque line pattern 20a and the fourth opaque line pattern 20b are 0.11 micrometers.

According to the preferred embodiment of this invention, the line widths of the parallel first opaque line pattern 10a, the second opaque line pattern 10b, the third opaque line pattern 20a and the fourth opaque line pattern 20b, and the widths of the space patterns 14a and 14b are substantially the same, for example, 0.11 micrometers.

Figure 5:
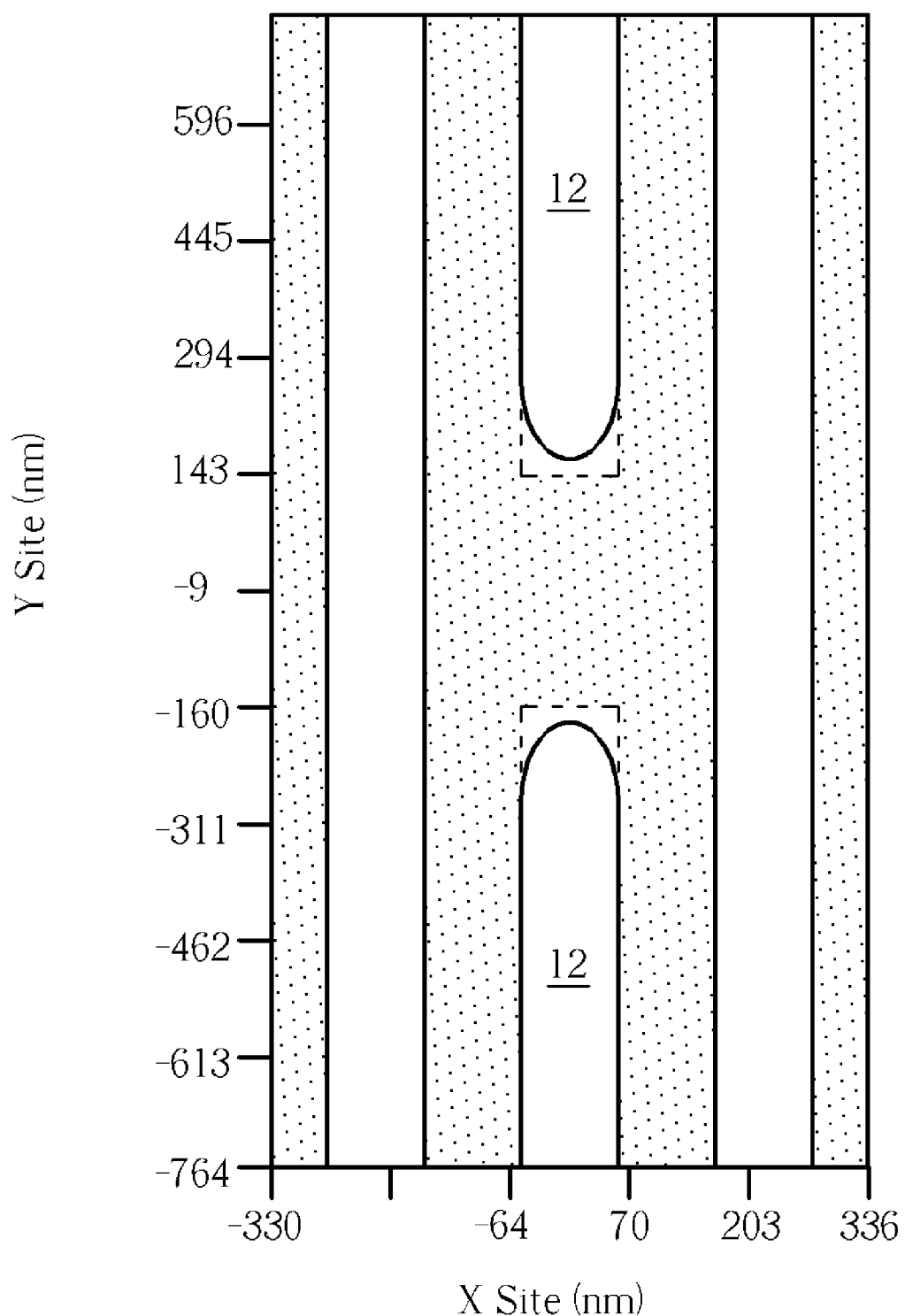
FIG. 5 illustrates an after-develop-inspect (ADI) pattern that is transferred from the photomask of FIG. 4 to a photoresist layer on a wafer through conventional lithographic processes.

FIG. 5 illustrates an after-develop-inspect (ADI) pattern that is transferred from the photomask of FIG. 4 to a photoresist layer on a wafer through conventional lithographic processes. According to the experimental results, the pull back of each side of the line-shaped pattern 12 can be controlled to a value that is less than 10 nm. In addition, the tapered bottleneck problem can be effectively resolved.

Those skilled in the art will readily observe that numerous modifications and alterations of the device and method may be made while retaining the teachings of the invention.

What is claimed is:

1. A photomask layout pattern comprising:
   an H-shaped pattern having a first line pattern in parallel with a second line pattern and a central line pattern connecting the first and second line patterns, and
   a plurality of space patterns inserted into the central line pattern to thereby split the central line pattern into dense line patterns.

2. The photomask layout pattern of claim 1 wherein a pitch of the dense line patterns is beyond resolution limit of an exposure tool such that light passing therethrough has an exposure energy that is not adequate to form corresponding line-space image on a photoresist.

3. The photomask layout pattern of claim 1 wherein the pitch of the dense line patterns is less than 130 nm.

4. The photomask layout pattern of claim 1 wherein the first line pattern, the second line pattern and the dense line patterns are opaque.

5. The photomask layout pattern of claim 1 wherein the space patterns are transparent.

6. The photomask layout pattern of claim 1 wherein the dense line patterns are perpendicular to the first and second line patterns.

7. The photomask layout pattern of claim 1 wherein the first and second line patterns have the same line width.

8. The photomask layout pattern of claim 7 wherein the line width is 0.11 micrometers.

9. A photomask layout pattern comprising:
   an H-shaped pattern having a first line pattern in parallel with a second line pattern and a central line pattern connecting the first and second line patterns, wherein a plurality of space patterns inserted into the central line pattern to thereby split the central line pattern into dense line patterns;
   a third line pattern situated adjacent to and parallel with the first line pattern;
   a first line-shaped space pattern between the first and third line patterns;
   a fourth line pattern situated adjacent to and parallel with the second line pattern; and
   a second line-shaped space pattern between the second and fourth line patterns, wherein the space patterns in the central line pattern prevent tapered bottleneck from occurring on the first and second line-shaped space pattern.

10. The photomask layout pattern of claim 9 wherein a pitch of the dense line patterns is beyond resolution limit of an exposure tool such that light passing therethrough has an exposure energy that is not adequate to form corresponding line-space image on a photoresist.

11. The photomask layout pattern of claim 9 wherein the pitch of the dense line patterns is less than 130 nm.

12. The photomask layout pattern of claim 9 wherein the first line pattern, the second line pattern and the dense line patterns are opaque.

13. The photomask layout pattern of claim 9 wherein the space patterns are transparent.

14. The photomask layout pattern of claim 9 wherein the dense line patterns are perpendicular to the first and second line patterns.

15. The photomask layout pattern of claim 9 wherein the first and second line patterns have the same line width.

16. The photomask layout pattern of claim 15 wherein the line width is 0.11 micrometers.

17. The photomask layout pattern of claim 9 wherein line widths of the first line pattern, the second line pattern, the third line pattern and the fourth line pattern are substantially the same.

* * * * *